(12) United States Patent
Itani

(10) Patent No.: US 7,683,488 B2
(45) Date of Patent: Mar. 23, 2010

(54) SEMICONDUCTOR DEVICE

(75) Inventor: Tsukasa Itani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 422 days.

(21) Appl. No.: 11/841,200

(22) Filed: Aug. 20, 2007

(65) Prior Publication Data

US 2008/0217783 A1 Sep. 11, 2008

(30) Foreign Application Priority Data

Aug. 21, 2006 (JP) ............................. 2006-224237

(51) Int. Cl.
*H01L 23/52* (2006.01)
(52) U.S. Cl. ................... 257/762; 257/E21.145
(58) Field of Classification Search ......... 257/758–762, 257/E23.145
See application file for complete search history.

(56) References Cited

U.S. PATENT DOCUMENTS

| | | | |
|---|---|---|---|
| 2004/0061236 A1 | 4/2004 | Koide | |
| 2004/0195575 A1* | 10/2004 | Komoda et al. | 257/77 |
| 2005/0275330 A1* | 12/2005 | Sung | 313/311 |
| 2007/0008867 A1* | 1/2007 | Anoikin et al. | 369/126 |
| 2007/0269964 A1* | 11/2007 | Sung | 438/479 |
| 2008/0003016 A1* | 1/2008 | Nakano | 399/159 |
| 2008/0217783 A1* | 9/2008 | Itani | 257/762 |
| 2008/0233396 A1* | 9/2008 | Raravikar et al. | 428/367 |
| 2009/0026914 A1* | 1/2009 | Nomura et al. | 313/498 |
| 2009/0075474 A1* | 3/2009 | Lee et al. | 438/637 |
| 2009/0269667 A1* | 10/2009 | Antonietti et al. | 429/231.4 |

FOREIGN PATENT DOCUMENTS

| | | |
|---|---|---|
| JP | 2004146798 A | 5/2004 |
| WO | 0201627 A1 | 1/2002 |

OTHER PUBLICATIONS

J. Robertson; "Ultrathin carbon coatings for magnetic storage technology"; 383 (2001), p. 81-p. 88.
Fujitsu; Low-k Interlayer Dielectrics for 65 nm-Node LSIs; 56, 4(Jul. 2005), p. 272-278.

* cited by examiner

Primary Examiner—Nathan W Ha
(74) Attorney, Agent, or Firm—Westerman, Hattori, Daniels & Adrian, LLP

(57) ABSTRACT

A semiconductor device is provided having an insulating layer structure with a low dielectric constant and excellent barrier properties against copper. This semiconductor device has a copper wiring layer and includes at least one layered structure having a copper wiring line, an amorphous carbon film with a density of 2.4 g/cm$^3$ or more, a porous silicon oxide insulating material layer, an amorphous carbon film with a density of 2.4 g/cm$^3$ or more and a copper wiring line in that order.

6 Claims, 5 Drawing Sheets

MODEL VIEW OF INTERLAYER INSULATING STRUCTURE

THICKNESS OF INTERLAYER
FILMS = D nm

MODEL VIEW OF INTERLAYER
INSULATING STRUCTURE

STRUCTURE OF SAMPLE FOR MEASURING
DIFFUSION PROFILE

MEASUREMENT VIEW

DIFFUSION OF Cu INTO SPECIFIC CARBON FILM

STRUCTURE FOR MEASURING
RELATIVE DIELECTRIC CONSTANT

RELATIONSHIP BETWEEN SPECIFIC CARBON
FILM THICKNESS AND EFFECTIVE RELATIVE
DIELECTRIC CONSTANT

SEMICONDUCTOR DEVICE

CROSS-REFERENCE TO RELATED APPLICATIONS

This application is based upon and claims the benefit of priority from the prior Japanese Patent Application No. 2006-224237, filed on Aug. 21, 2006, the entire contents of which are incorporated herein by reference.

BACKGROUND OF THE INVENTION

1. Field of the Invention

The present invention relates to a semiconductor device with a low dielectric constant.

2. Description of the Related Art

As semiconductor integrated circuits, multilayer wiring devices and other semiconductor devices have attained greater levels of integration and higher element densities, the wire spacing has become tighter, leading to wiring delays due to the increased capacity between wiring lines.

The wiring delay T is affected by the wiring resistance and capacity between wiring lines, and is a property represented by:

$$T \propto CR$$

(with R being wiring resistance and C being capacity between wiring lines).

In this formula, the capacity C between wiring lines is represented by:

$$C = \varepsilon S/D$$

with D representing a wire spacing, S, an electrode area (area of facing wire line surfaces), and $\varepsilon$, a dielectric constant of an insulating material provided between the wiring lines.

Consequently, lowering the dielectric constant of the insulating film is an effective means for reducing wiring delays.

Conventionally, silicon dioxide ($SiO_2$), silicon nitride (SiN), phosphorus silicate glass (PSG) and other inorganic films as well as polyimide and other organic polymers have been used as insulating materials.

However, the relative dielectric constant of CVD-$SiO_2$ films, which are used most commonly in semiconductor devices, is about 4. Even SiOF films, which have been studied as low-dielectric constant CVD films, only have a relative dielectric constant of about 3.3 to 3.5.

Under these circumstances, nanoclustering silica (NCS), which is a silica with uniformly distributed holes with a size on a nanometer order, has been developed as a promising interlayer insulating material with a low dielectric constant. This material has a relative dielectric constant of 2.25, much lower than those of conventional materials, and its use in integrated circuits is being studied.

However, in the case of semiconductor devices using copper wiring lines, the copper used in the wiring is known to diffuse into the insulating film when a silicon oxide substance is used as the interlayer insulating film, detracting from the electrical properties of the insulating layer and critically affecting the operation of the device. Consequently, a film (simply called a diffusion prevention film) aimed at preventing diffusion or like of the copper is disposed between the interlayer insulating film and the wiring lines. See for example, Japanese Patent Application Laid-open No. 2004-146798 (paragraphs 0001 to 0006).

SUMMARY OF THE INVENTION

It is an object of the present invention to provide a semiconductor device capable of reducing the "dielectric constant", or in other words a semiconductor device capable of reducing the electrical capacity between wiring lines, taking into consideration the total of all substances that are disposed between wiring. Other objects and advantages of the present invention will be made clear from the explanation below.

One aspect of the present invention provides a semiconductor device with a copper wiring layer, having at least one layered structure including a copper wiring line, an amorphous carbon film with a density of 2.4 g/cm³ or more, a porous silicon oxide insulating material layer, an amorphous carbon film with a density of 2.4 g/cm³ or more and a copper wiring line in that order.

This aspect of the present invention provides a semiconductor device having an insulating layer structure with a low dielectric constant and excellent barrier properties against copper.

The present invention provides a semiconductor device having an insulating layer structure with a low dielectric constant and excellent barrier properties against copper.

DESCRIPTION OF THE PREFERRED EMBODIMENTS

Embodiments of the present invention are explained below using figures, formulae, tables, examples and the like. These figures, formulae, tables, examples and explanations only exemplify the present invention, and do not limit its scope. Other embodiments can of course be included in the scope of the present invention so long as they match its intent.

The semiconductor device is a semiconductor device having a copper wiring layer, and having at least one layered structure including a copper wiring line, an amorphous carbon film with a density of 2.4 g/cm³ or more (hereunder sometimes called a "specific carbon film"), a porous silicon oxide insulating material layer (hereunder sometimes called a "specific insulating material layer"), a specific carbon film and a copper wiring line in that order. A semiconductor device having an insulating layer structure with a low dielectric constant and excellent barrier properties against copper is provided by means of this configuration. The specific carbon film is preferably a carbon film formed by a filtered cathodic arc (FCA) method.

Figure 1:
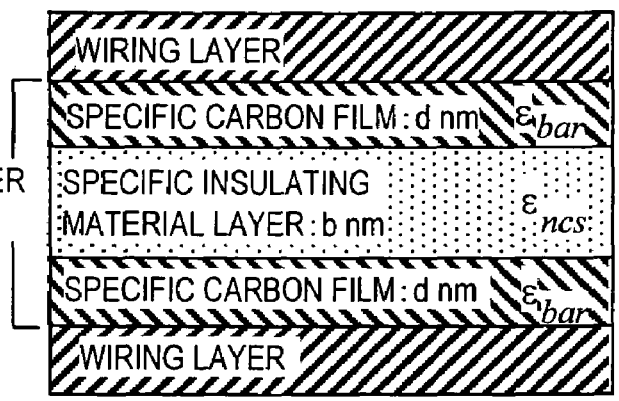
FIG. 1 is a model view of an insulating layer structure based on the present invention.

This can be explained for example with reference to FIG. 1. FIG. 1 is a model view showing an insulating layer structure based on the present invention. In this structure, the effective capacity $C_{all}$ between wiring layers can be expressed as follows given $C_{ncs}$ and $C_{bar}$ as the effective capacities of the specific insulating material layer and specific carbon film, respectively.

$$1/C_{all}=1/C_{ncs}+2/C_{bar}$$

Thus, as shown in FIG. 1, if the dielectric constant of the specific insulating material layer is given as $\in_{ncs}$, the dielectric constant of the specific carbon film as $\in_{bar}$, the film thickness of the specific insulating material layer as b(nm), the film thickness of the specific carbon film as d(nm), the distance between wiring layers as D(nm) and the electrode area as S(nm), then:

$$1/c_{all}=(D-2d)/\in_{ncs}S+2\times(d/\in_{bar}S)=1/S\{(D-2d)/\in_{ncs}+2d/\in_{bar}\}$$

In this case, if:

$$\in_{bar}=k\in_{ncs}$$

(wherein k is a constant), then:

$$1/C_{all}=1/\in_{ncs}S\{D+2d(1/k-1)\}.$$

Consequently, the effective capacity $C_{all}$ between layers can be expressed as:

$$C_{all}=\in_{ncs}S/\{D+2d(1/k-1)\}$$

Thus, it can be seen that if the distance (D) between wiring layers is fixed, the effective capacity between wiring layers can be reduced even if the dielectric constant of the specific carbon film is higher than the dielectric constant of the specific insulating material layer, by reducing the thickness (d) of the specific carbon film and increasing the thickness of the specific insulating material layer by the same amount. That is, the effective dielectric constant of the entire insulating layers between wiring layers can be reduced, thereby effectively reducing the wiring delay.

In this layered structure, the term "a copper wiring line" is applied because not only a case in which the combination of a specific carbon film, a specific insulating material layer and a specific carbon film intervenes between two layers of copper wiring lines but also a case in which the combination is present between two copper wiring lines within the same layer of copper wiring lines is included in the present invention. That is, this layered structure may exist either in the direction of layering of the semiconductor device or perpendicular to the direction of layering. The direction of layering of the semiconductor device here means for example the direction of layering of multiple layers in a multilayer wiring device.

This layered structure may be present between all copper wiring lines or between only some copper wiring lines. "Only some" here applies to a variety of cases, such as, if there are two or more combinations of copper wiring layers, when the layered structure is present between only some of the combinations of copper wiring layers, when the layered structure is present between only some interlayer part of one combination of wiring layers, when the layered structure is present between copper wiring layers but not present between copper wiring lines within the same wiring layer, or when the layered structure is present between copper wiring lines within the same wiring layer but not present between copper wiring layers.

The method of preparing the copper wiring lines of the present invention is not limited, and they can be prepared by known methods. The thickness and width thereof are also not particularly limited.

The specific carbon film intervenes between a copper wiring line and a specific insulating material layer. Since the film structure is hard, it may be called a hard carbon film. The specific carbon film may be any amorphous carbon film with a density of 2.4 g/cm³ or more, but is preferably formed by a filtered cathodic arc method. The thickness should generally be 1 nm or more so that migration of copper from the copper wiring line can be prevented to a desired degree. Below 1 nm, the barrier properties against copper will often be inadequate. The upper limit is preferably 13 nm or less. Above 13 nm, the effective capacity between copper wiring lines increases, and there is less advantage to using the specific carbon film.

The filtered cathodic arc method is explained in detail in J. Robertson, Thin Solid Films, 2001, Vol. 383, p. 81. It can be explained simply as follows. Using solid graphite or the like as the cathode, arc discharge is generated in vacuum between the cathode and a facing anode. Carbon ions and electrons are released into the vacuum as a plasma flow from the graphite of the cathode. The plasma flow is bent with a magnetic field filter or the like to remove neutral particles contained in the plasma, which is then directed at a substrate to deposit a carbon film on the substrate.

The dielectric constant of the specific carbon film can be altered by means of the conditions of film formation, but using current technology it cannot be less than the dielectric constant of the specific insulating material layer if the film is to have adequate copper barrier properties. Even so, however, it has been found that the effective capacity between wiring layers can be lowered for the reasons explained above if an appropriate film thickness is selected. The relative dielectric constant range of the specific carbon film is not particularly limited, but generally one can be obtained with a dielectric constant in the range of 2.7 or more.

The thicknesses, densities, relative dielectric constants and other properties and preparation conditions for the aforementioned two specific carbon films may be the same or different.

The specific insulating material layer of the present invention refers to a layer consisting of an insulating material having silicon and oxygen as its principal components and having internal pores, and can be prepared by any method that meets these conditions, but it is particularly desirable to use nanoclustering silica, which consists of silica particles with uniformly dispersed holes with a size on a nanometer order. Nanoclustering silica can be obtained from Catalysts & Chemicals Ind. Co., Ltd. under the model name of Ceramate NCS for example. Such nanoclustering silica can be obtained in a form of a solution or dispersion, and can therefore be made into a film by for example application by spin coating followed by heat treatment. See Fujitsu (Journal), Vol. 56, April for details on nanoclustering silica.

The thickness of the specific insulating material layer of the present invention is not particularly limited, and can be determined according to the necessary level of insulation. The relative dielectric constant is preferably as low as possible, but may be limited by considerations of physical strength. It should generally be 2.4 or less.

Regarding the interrelationship between the specific carbon film and specific insulating material layer, it has been shown that the film thickness ratio of one layer of the specific carbon film and one specific insulating material layer {that is, (the thickness of one layer of the specific carbon film)/(the thickness of one specific insulating material layer)} is preferably 0.13 or less. Above 0.13, the overall dielectric constant may not be reduced sufficiently.

The present invention may be applied to any semiconductor device but a semiconductor device having a highly integrated layered wiring structure is particularly suitable because it requires a low dielectric constant. The specific carbon film and specific insulating material layer of the present invention can be called by any other names and still belong to the present invention as long as they fulfill the conditions described above. To cite the most commonly used names, the specific carbon film may be called a diffusion prevention film, diffusion prevention layer, cap layers etching stopper layer or the like, while the specific insulating material layer may be called an interlayer insulating film, interlayer insulating layer, ILD layer, wiring insulation layer or the like.

EXAMPLES

Examples of the present invention are explained below. The following analytical methods were used.

(Relative Dielectric Constant and Effective Relative Dielectric Constant Between Layers)

These were measured by means of alternating current signals at 1 MHz using an Agilent Technology LCR Meter (HP-4284A) and a needle probe.

(Density)

A carbon film was formed on a Si wafer, and measured with a high-resolution RBS unit (Rutherford backscattering spectrometer, Kobe Steel HRBS-500).

(Film Thickness)

This was measured with a spectroscopic ellipsometer (Sopra). Cross-sections were also observed and measured by TEM as necessary.

Example 1

Figure 2:
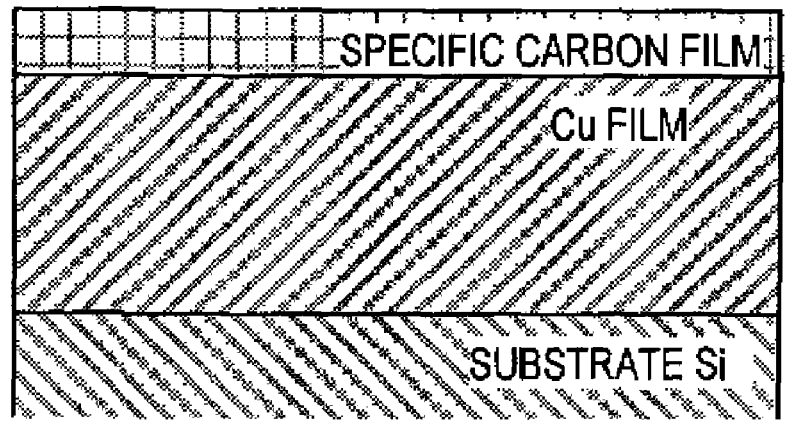
FIG. 2 is a model view showing the structure used in Example.

A copper film was formed to 40 nm by sputtering on a Si wafer, and a carbon film was formed thereon to 1 nm by a filtered cathodic arc method to prepare a carbon film/copper film layered body with the structure shown in FIG. 2. The film-forming conditions for both are shown in Table 1. NTI Co. equipment was used to form the carbon film, with graphite as the sputtering source. When forming the carbon film, the discharge current conditions were altered to adjust the film-forming speed appropriately and prepare films of different densities.

TABLE 1

| Film to be formed | Copper film | Specific carbon film |
| --- | --- | --- |
| Film-forming method | DC sputtering | FCA |
| Pressure during film formation (Pa) | 0.5 | $5 \times 10^{-3}$ |
| Substrate temperature (° C.) | 200 | Room temperature |
| Output | 750 W | 120 V, 60 A |
| Film-forming speed (nm/minute) | 6 | 0.05 to 0.4 |

Figure 3:
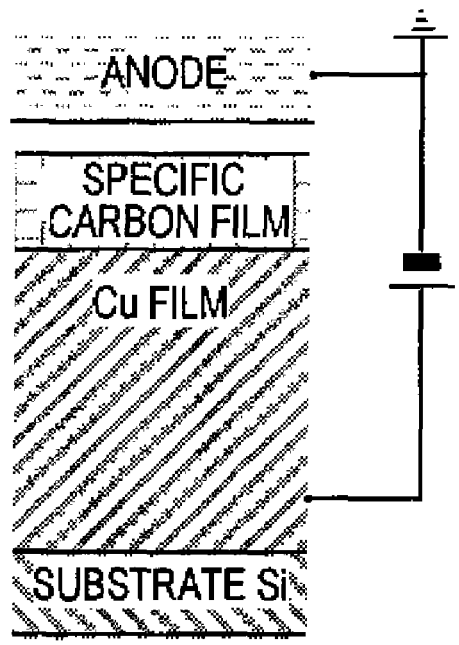
FIG. 3 is a model view for purposes of explaining the method for evaluating the copper barrier properties of the specific carbon film used in Example 1.

Current was applied by the methods shown in FIG. 3 to these layered bodies to evaluate the copper barrier properties of the carbon films. That is, a voltage of 20 V was applied between a pair of facing aluminum electrodes on either side of the copper film and carbon film and maintained for 200 hours at 250° C., and then, copper distribution near the surface of the structure (that is, near the upper surface of the carbon layer in FIG. 4), was measured with a high-resolution RBS device (Rutherford backscattering spectrometer, Kobe Steel HRBS-500).

Figure 4:
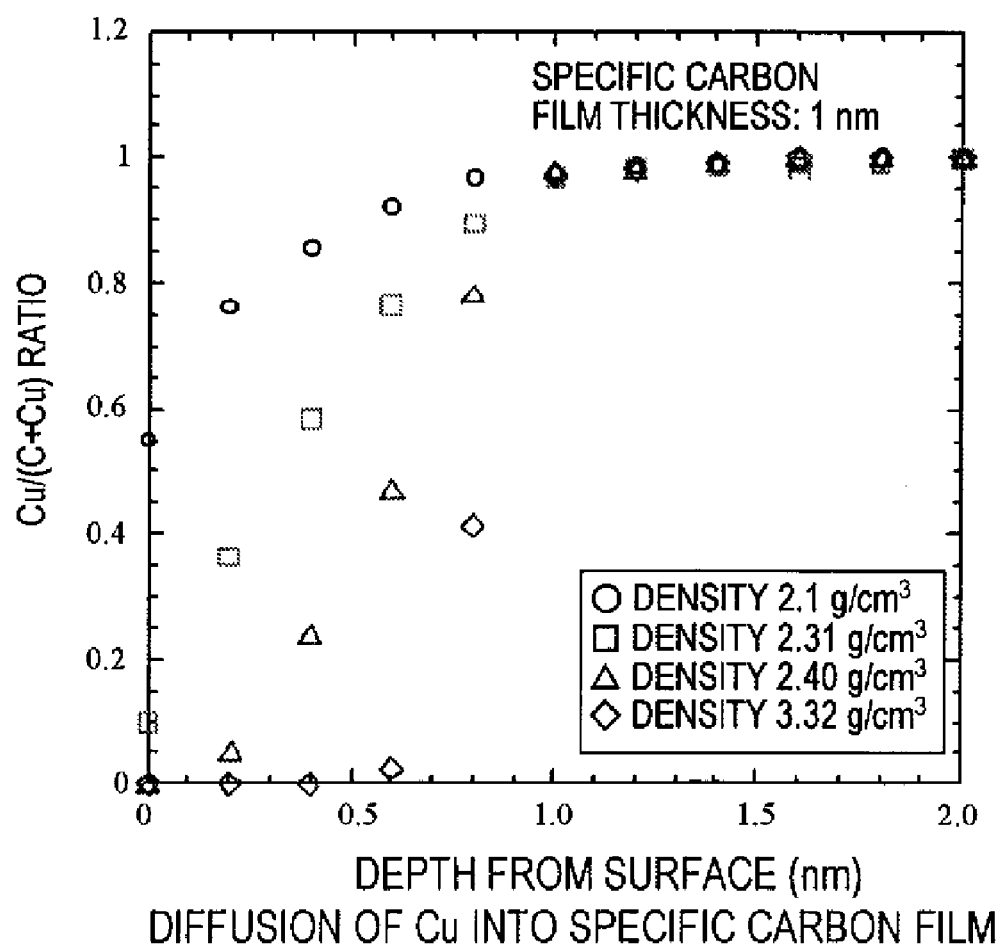
FIG. 4 is a graph showing the effect of the density of the specific carbon film on copper diffusion.

The relationship between carbon film density and copper barrier properties is shown in FIG. 4. In FIG. 4, the position of the carbon film upper surface is indicated at the far left. At 1 nm the copper film is reached, and much more copper is detected. These results show that when the density of the carbon film is 2.4 g/cm$^3$ or more, diffusion of copper inside the carbon film is greatly reduced.

Figure 5:
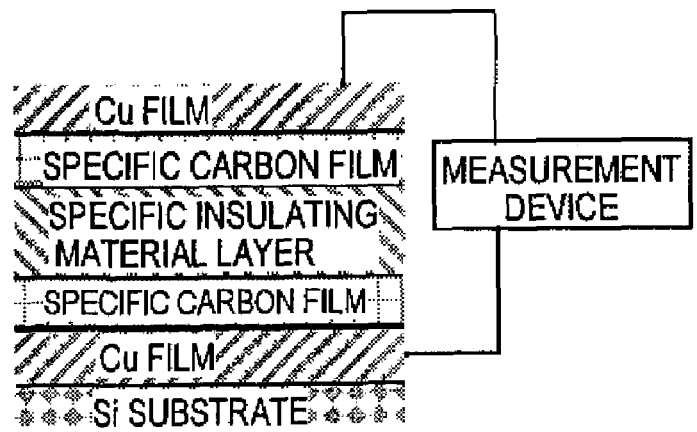
FIG. 5 is a model view for purposes of explaining the method for evaluating the effective relative dielectric constant of the structure of the present invention.

Next, the structure shown in FIG. 5 was prepared in order to evaluate the relative dielectric constant of a layer sandwiched between copper layers. Both copper layers had a thickness of 200 nm. In this case, the structure shown in FIG. 2 was prepared, and a specific insulating material layer, specific carbon film and copper film were layered thereon in that order. The conditions for forming the second specific carbon film and second copper film were the same as those for preparing the structure of FIG. 2.

The specific insulating material layer was applied by spin coating (3000 rev/min, 30 seconds) using Catalysts & Chemicals Ind. Co., Ltd. nanoclustering silica (model name: Ceramate NCS), and then subjected to heat treatment at 300° C. in an N$_2$ gas atmosphere to prepare a 100 nm thick film. The relative dielectric constant of this layer was 2.4.

The specific carbon films were prepared to various thicknesses, with both layers having the same thickness and the same density (3.32 g/cm$^3$).

Figure 6:
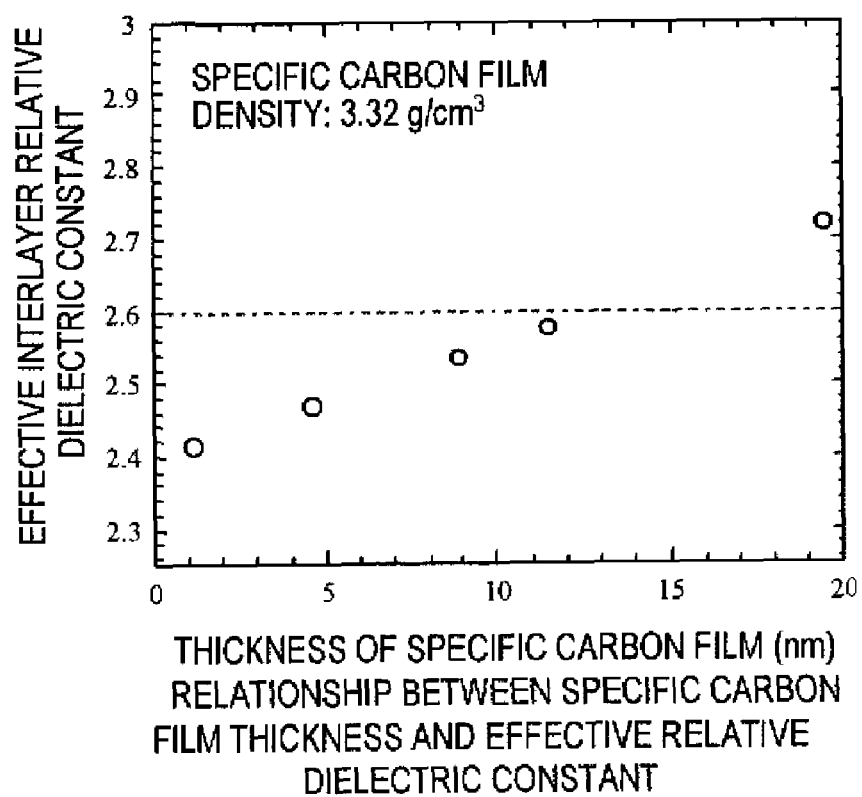
FIG. 6 is a graph showing the relationship between the thickness of the specific carbon film and the effective relative dielectric constant of the structure of the present invention.

FIG. 6 shows the relationship between the thickness of the specific carbon film (density 3.32 g/cm$^3$) and the interlayer effective relative dielectric constant of the structure. The relative dielectric constant of the specific carbon film in this case was 3.8.

According to FIG. 6, the thicker the specific carbon film, the higher the interlayer effective relative dielectric constant (that is, the effective relative dielectric constant of the region sandwiched between the two copper films), and the effective relative dielectric constant exceeds 2.6 at around 13 nm. According to the ITRS (International Semiconductor Road Map) an effective relative dielectric constant of about 2.6 will be required for the coming age of hp 45 nm, and in this case it appears that the specific carbon film needs to be 13 nm or less in thickness. When the thickness of the specific carbon film is 13 nm, the film thickness ratio of one layer of specific carbon film and one specific insulating material layer {that is, (the thickness of one layer of specific carbon film)/(the thickness of one specific insulating material layer)} is 0.13.

Example 2

Figure 7:
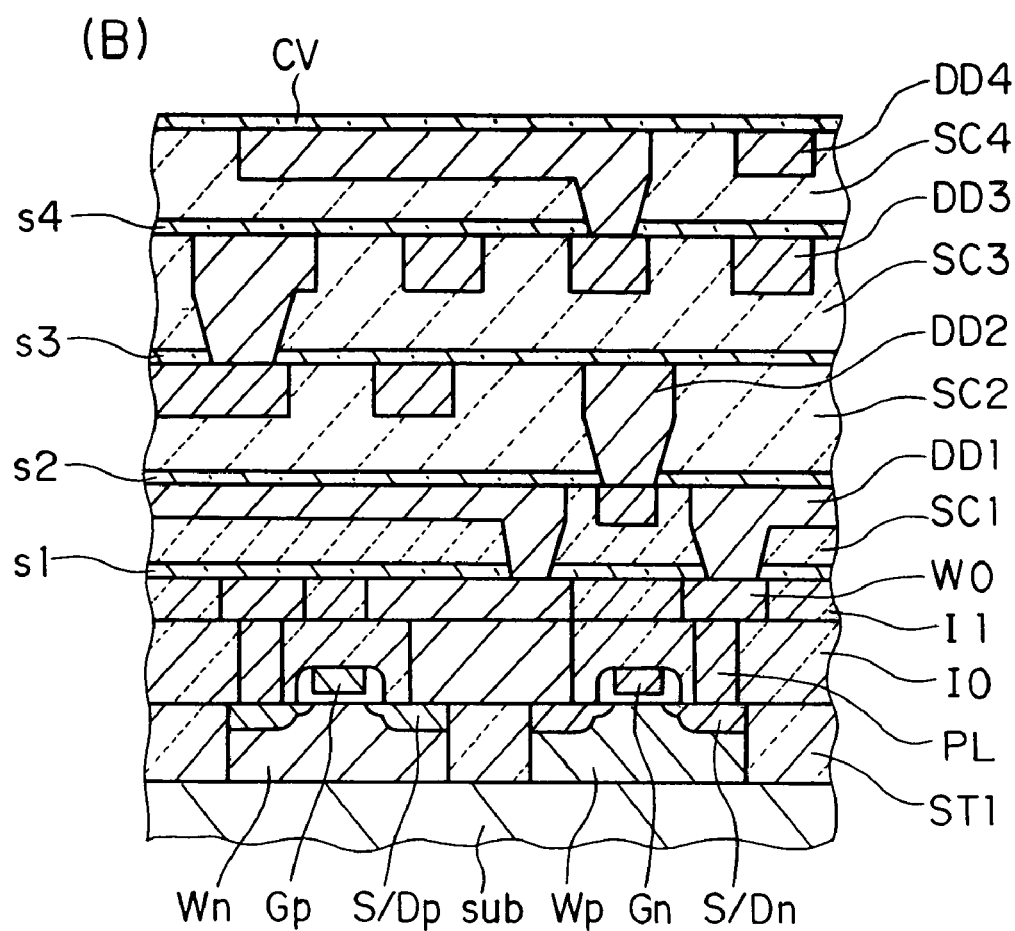
FIG. 7 is a model cross-sectional view of the semiconductor integrated circuit of Example 2.

FIG. 5 shows the configuration of an insulating layer to be installed between wiring layers. FIG. 7 shows a rough cross-section of a semiconductor integrated circuit having a layered structure of specific carbon film/specific insulating material layer/specific carbon film.

In FIG. 7, an n-type well Wn and an p-type well Wp are formed on the surface of a silicon substrate sub. An element isolating region STI is also formed by shallow trench isolation so as to surround the active region. A P-type gate electrode Gp is formed on the n-type well Wn, and p-type source/drain regions S/Dp are formed with an LDD configuration on both sides thereof. Similarly, an n-type gate electrode Gn is formed above the p-type well Wp, and n-type source/drain regions S/Dn are formed on both sides thereof. A first lower insulating layer I0 is formed on the surface of this silicon substrate, with contact holes formed therein.

A contact hole is filled with plug electrode PL made of W. A second lower insulating layer I1 is formed on the first lower insulating layer I0, with lower wiring lines W0 embedded therein. The lower insulating layers I0 and I1 are formed of silicon oxide for example, while the lower wiring lines W0 are formed of copper.

An etching stopper layer S1, low-dielectric constant insulating layer SC1, etching stopper layer S2, low-dielectric constant insulating layer SC2, etching stopper layer S3, low-dielectric constant insulating layer SC3, etching stopper layer S4 and low-dielectric constant insulating layer SC4 are layered so as to cover the lower wiring lines W0 and the second lower insulating layer I1. Dual damascene wiring lines DD1, DD2, DD3 and DD4 are formed of copper respectively, from the lower layer toward the upper layer in these 4 interlayer insulating layers. Cover layer CV is formed on the top layer.

Low-dielectric constant insulating layers SC1 to SC4 are each formed by the "specific carbon film/specific insulating material layer/specific carbon film" of the present invention. The thickness of one layer of specific carbon film in this case is 10 nm, while the thickness of one specific insulating material layer is 170 nm.

Etching stoppers S1 to S4 are formed for example from SiN or $SiO_2$ film. A cover layer CV is formed for example from SiN film.

By thus adopting a "specific carbon film/specific insulating material layer/specific carbon film" structure, it is possible to prevent copper diffusion and to insulate a wiring layer with insulating layers having an extremely low relative dielectric constant. The "specific carbon film/specific insulating material layer/specific carbon film" layered structure may of course be adopted for only part of a device. Any configuration can be used for the other parts of the device such as a wiring layer for example, which may be prepared by known techniques.

The aforementioned semiconductor integrated circuit was prepared with the specific carbon film and specific insulating material layer prepared as in Example 1 (with relative dielectric constants of 3.8 and 2.4, respectively), while another semiconductor integrated circuit was prepared with a similar structure except that a common Si:C:O:H (Low-k film, also called SiOC film)/specific insulating material layer/Si:C:O:H configuration was used for SC1 to SC4 for purposes of comparison. The thickness of the Si:C:O:H film was 45 nm, and the thickness of the specific insulating material layer was 100 nm.

When the wiring delay times of these two types of integrated circuits were compared, the integrated circuit with the specific carbon film/specific insulating material layer/specific carbon film configuration had an 11% shorter delay time.

What is claimed is:

1. A semiconductor device with a copper wiring layer, having at least one layered structure comprising a first copper wiring line, a first amorphous carbon film with a density in a range between 2.4 $g/cm^3$ and 3.4 $g/cm^3$ in contact with the first copper wiring line, a porous silicon oxide insulating material layer in contact with the first amorphous carbon film, a second amorphous carbon film with a density in a range between 2.4 $g/cm^3$ and 3.4 $g/cm^3$ in contact with the porous silicon oxide insulating material layer, and a second copper wiring line in contact with the second amorphous carbon film.

2. The semiconductor device according to claim 1, wherein at least one of said first and second amorphous carbon films is a carbon film formed by a filtered cathodic arc method.

3. The semiconductor device according to claim 1, wherein said layered structure is present in at least either a direction of layering or a direction perpendicular to the direction of layering of the semiconductor device.

4. The semiconductor device according to claim 1, wherein the thickness ratio of one layer of said carbon film and one insulating material layer {that is, (the thickness of one layer of said carbon film)/(the thickness of one insulating material layer)} is 0.13 or less.

5. The semiconductor device according to claim 1, wherein the thickness of one layer of said carbon film is in the range of 1 to 13 nm.

6. The semiconductor device according to claim 1, wherein the relative dielectric constant of the porous silicon oxide insulating material forming the insulating material layer is 2.4 or less.

* * * * *